United States Patent [19]

Grabbe

[11] Patent Number: 4,906,194

[45] Date of Patent: Mar. 6, 1990

[54] HIGH DENSITY CONNECTOR FOR AN IC CHIP CARRIER

[75] Inventor: Dimitry G. Grabbe, Middletown, Pa.

[73] Assignee: AMP Incorporated, Harrisburg, Pa.

[21] Appl. No.: 337,730

[22] Filed: Apr. 13, 1989

[51] Int. Cl.⁴ .......................................... H01R 23/72
[52] U.S. Cl. ...................................... 439/71; 439/66; 439/608
[58] Field of Search .......................... 439/66, 68–75, 439/591, 824, 331, 608; 324/158 P, 158 F

[56] References Cited

U.S. PATENT DOCUMENTS

| | | | |
|---|---|---|---|
| 4,199,209 | 4/1980 | Cherian et al. | 439/591 |
| 4,443,756 | 4/1984 | Lightbody et al. | 439/66 |
| 4,699,593 | 10/1987 | Gbabbe et al. | 439/71 |

FOREIGN PATENT DOCUMENTS 2929175  2/1981  Fed. Rep. of Germany ... 324/158 P

Primary Examiner—Neil Abrams
Attorney, Agent, or Firm—James M.D. Trygg

[57] ABSTRACT

A high density connector assembly for an IC chip carrier (10) includes a stack of spacer plated (30) having apertures (32) which form chambers for holding planar contact members (22) therein. The stack of spacer plates (30) are sandwiched between a lower reference plate (34) and an upper reference plate (36) which have precisely located apertures (42, 44) communicating with the chambers for precisely positioning contact portions (26, 28) of the contact members (22) with respect to contact pads (14, 18) on the IC chip module (10) and a printed circuit board (12). The plates (30, 34, 36) are preferably formed of a dielectric coated metal material to provide a ground shield around the contact members (22) to prevent cross talk therebetween.

15 Claims, 4 Drawing Sheets

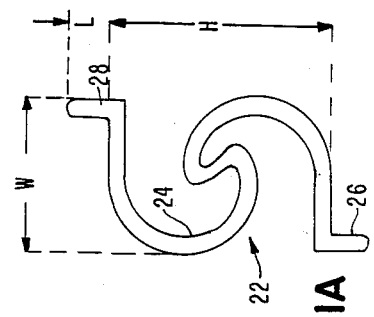
FIGURE IC
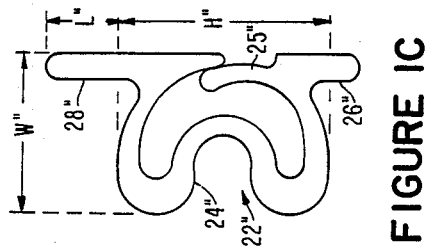
FIGURE IA
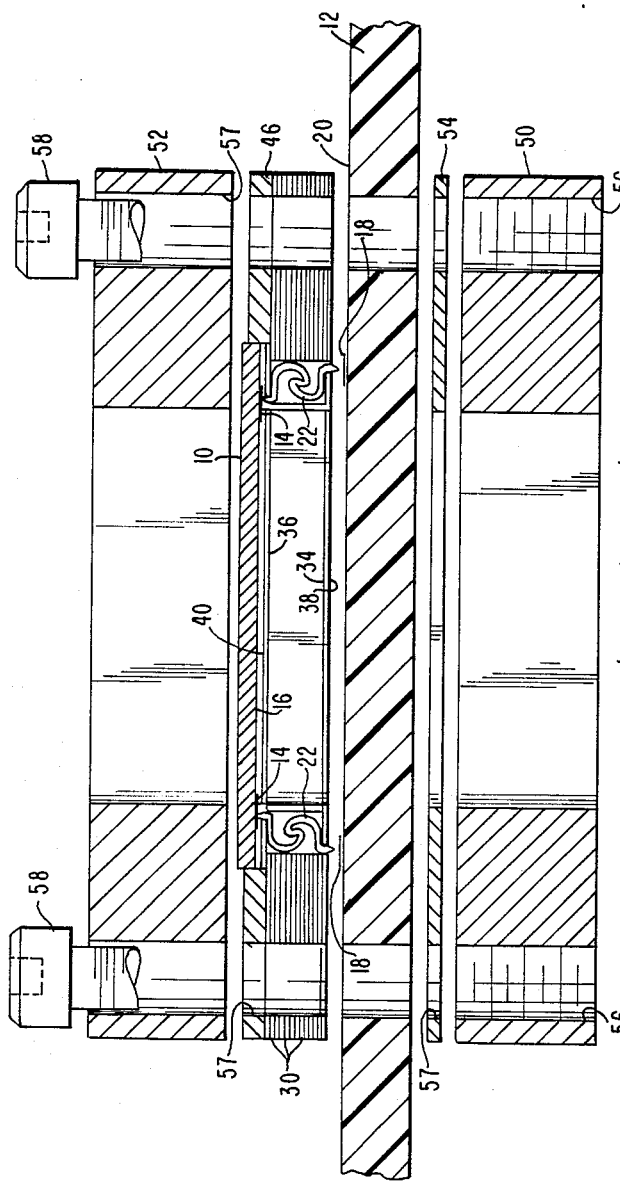
FIGURE 3
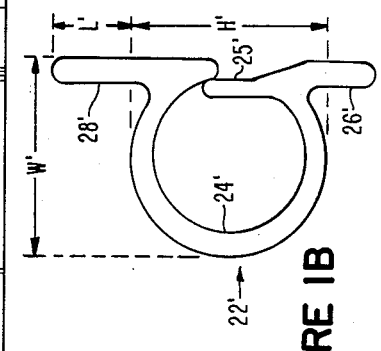
FIGURE IB 4,906,194

HIGH DENSITY CONNECTOR FOR AN IC CHIP CARRIER

BACKGROUND OF THE INVENTION

This invention relates to connectors for integrated circuit chips and multi-chip substrates and, more particularly, to such a connector which provides for high density contacts in a separable assembly.

Integrated circuits (IC's) are conventionally carried on silicon modules which are like miniature printed circuit boards on which an interconnection pattern (in one or more layers) and contact pads are deposited. Such substrates may also incorporate active devices, line drivers, receivers, etc. A module may contain several IC chips which are mounted on the substrate by means of flip chip, wire bond or tape automated bonding methods, for example. This technology results in a very high interconnection density on the module. For example, the flip chip technology utilizes only 0.001" high solder bumps on centers as small as 0.004" to yield an extremely dense package. The modules are then interconnected via a printed circuit board. For reasons of minimizing the impact of signal propagation delay, such modules must be interconnected in as small an area as possible. Accordingly, it is an object of this invention to provide an assembly for the high density connection of an IC chip module to a printed circuit board or similar substrate.

In terms of connector density, the technology of connector assemblies has progressed from plated-through hole mounted contacts, to pin and socket combinations, to surface soldering, to the current use of interposers, the latter being exemplified by U.S. Pat. No. 4,699,593, issued on Oct. 13, 1987 and assigned to the assignee of the present invention. The interposer and similar methods typically use an insulator as a means of positioning or orienting contacts, which typically are spring members. However, when the dimensions of the plastic material separating adjacent contacts is below certain limits, the traditional technology of molding plastic becomes inadequate. There is a limitation of the space between core pins in the mold into which the plastic will flow, provide an adequate packing density and retain at least some mechanical strength when extracted from the mold. The technology of reaction injection molding is better able to produce small geometries. However, this is associated with difficulty in manufacturing small geometries without flash, which frequently dimensionally approaches the size of the contact separators or ribs. Additionally, since it is desirable to have a controlled characteristic impedance of the signal from the module to the printed circuit board without discontinuity, the use of plastics imposes a limitation, since the close proximity of the contacts results in cross talk therebetween. This cross talk problem may be alleviated by connecting alternate contacts to ground to provide a reference ground plane. However, this severely impacts the interconnection density which can be achieved. It is therefore a more specific object of this invention to provide a connector assembly between the IC chip module and a printed circuit board which has controlled impedance, wave guide properties, low electrical resistance, short electrical length, high density and reliability. Occasionally, an IC module becomes defective after installation on a printed circuit board. In such case, it is desirable to be able to replace such a module without requiring the replacement of the entire printed circuit board. Accordingly, it is a further object of this invention to provide a connector assembly which satisfies all of the foregoing requirements and, in addition, is separable to allow replacement of the module.

SUMMARY OF THE INVENTION

The foregoing and additional objects are attained in accordance with the principles of this invention by providing a separable connector assembly wherein the contact members are precisely positioned by means of a plurality of plates having aligned apertures which, when the plates are stacked, form chambers for holding the contact members.

In accordance with a feature of this invention, the plates are made of a metal material coated with an insulating layer so that the stack of plates provides a ground shield around the contact members to prevent cross talk.

BRIEF DESCRIPTION OF THE DRAWINGS

The foregoing will be more readily apparent upon reading the following description in conjunction with the drawings in which like elements in different figures thereof have the same reference numeral and wherein:

FIGS. 1A, 1B and 1C illustrate exemplary forms for the contact member of the inventive connector assembly;

FIG. 3 is a semi-exploded cross-sectional view through the connector assembly of FIG. 2, showing an embodiment utilizing the contact member shown in FIG. 1A;

DETAILED DESCRIPTION

Figure 2:
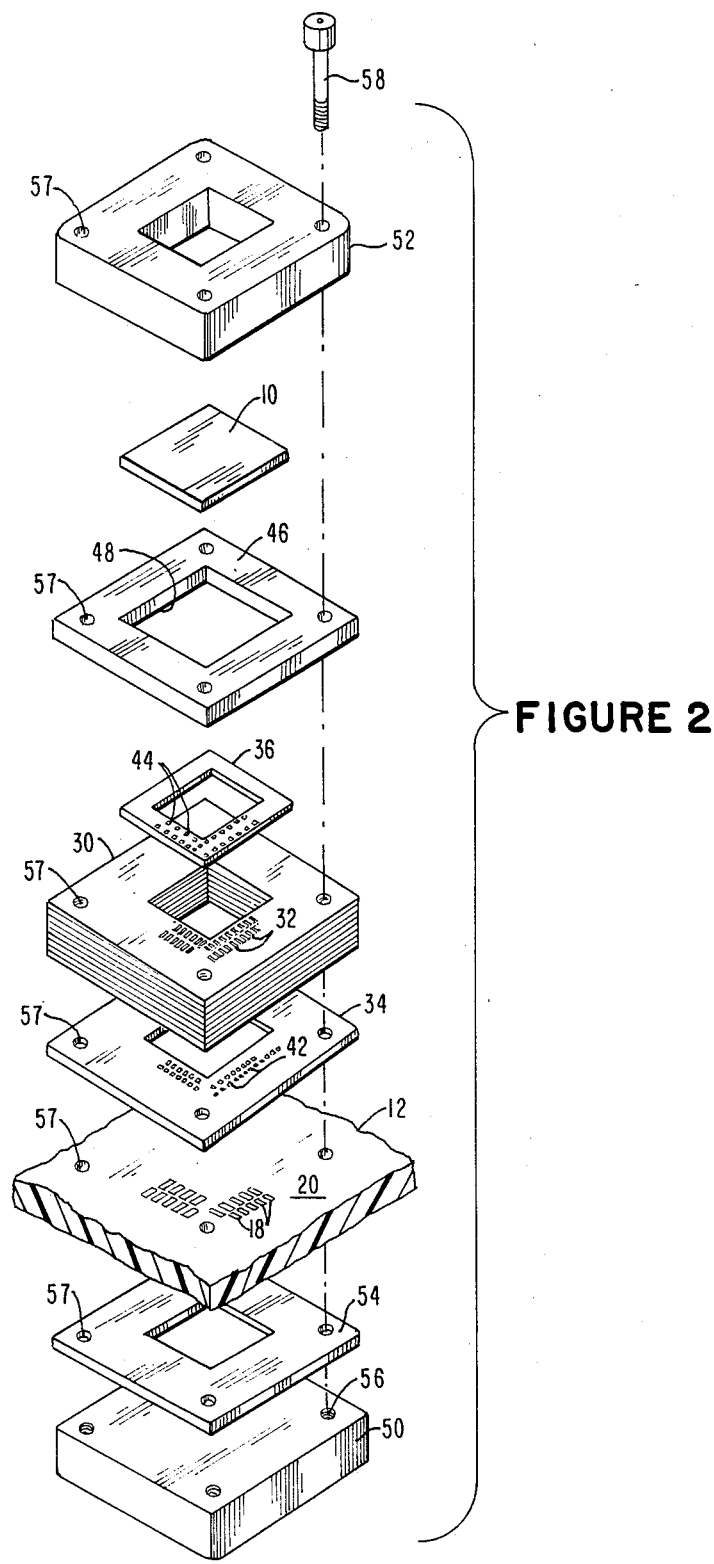
FIG. 2 is an exploded perspective view showing a separable connector assembly constructed in accordance with the principles of this invention.
Figure 4:
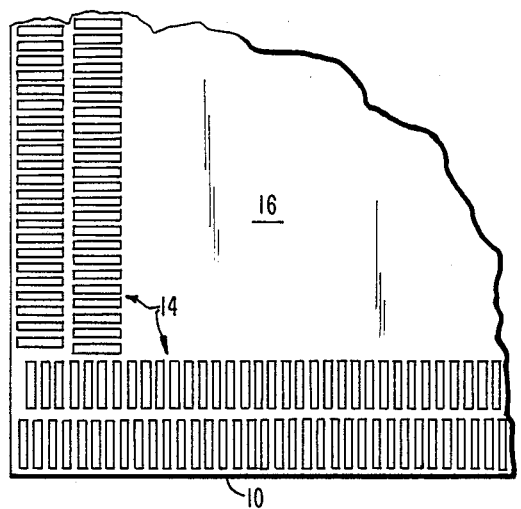
FIG. 4 is a detailed view showing a pattern of contact pads on the IC chip module.
Figure 5:
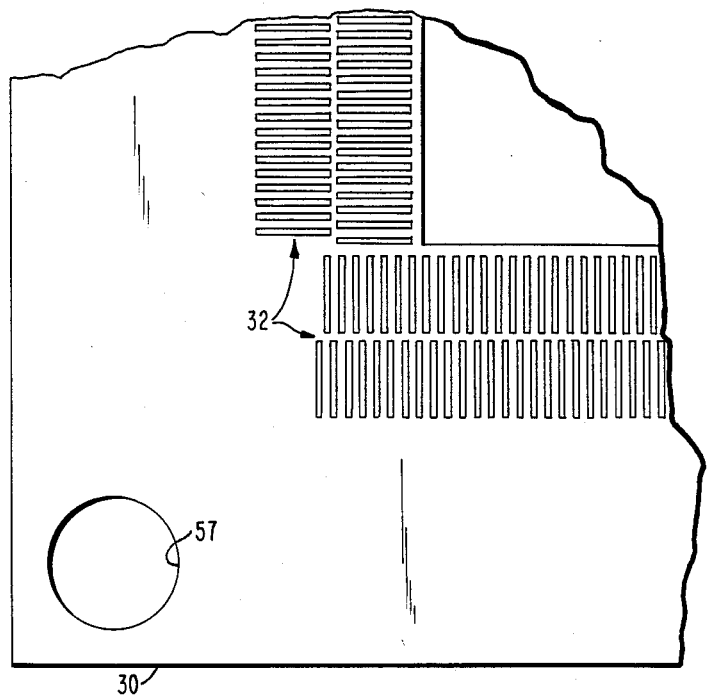
FIG. 5 is a detailed view showing a pattern of apertures in the spacer plates of the inventive connector assembly.
Figure 6:
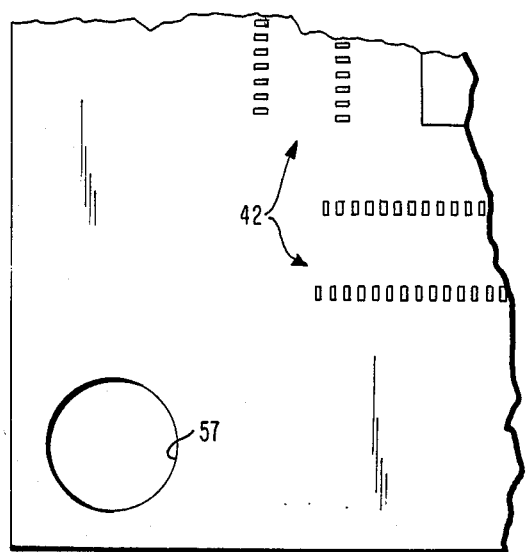
FIG. 6 is a detailed view showing a pattern of apertures in the lower reference plate of the inventive connector assembly.
Figure 7:
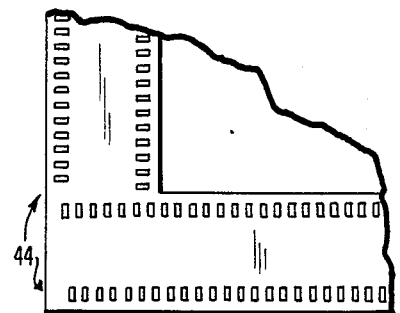
FIG. 7 is a detailed view showing a pattern of apertures in the upper reference plate of the inventive connector assembly.
Figure 8:
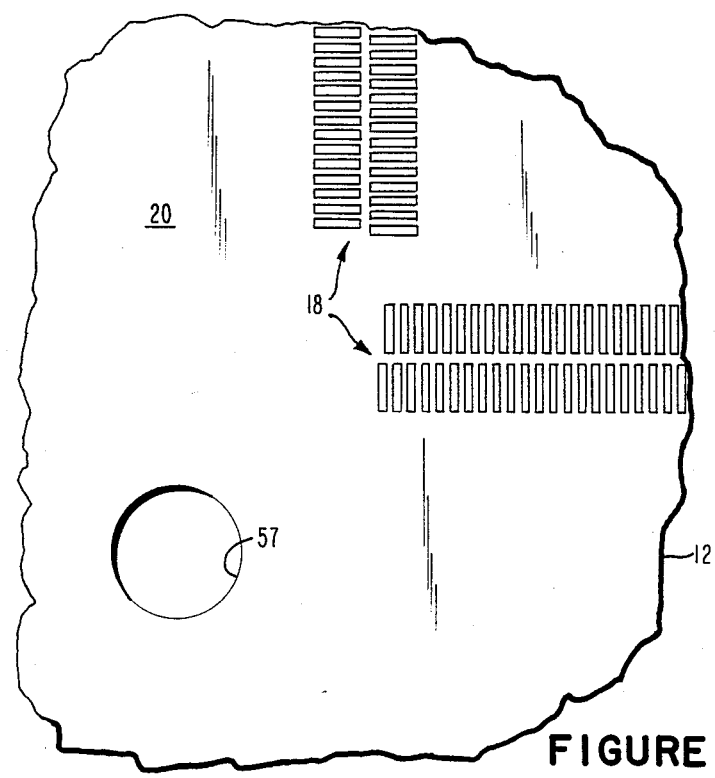
FIG. 8 is a detailed view showing a pattern of contact pads on the printed circuit board.

Referring now to the drawings, it is desired to connect a pattern of contact pads (FIG. 4) on the IC chip carrier, or module, 10 (FIG. 2) to a pattern of corresponding contact pads on the printed circuit board 12 (FIG. 2). Typically, the module 10 is a silicon substrate, approximately 0.020" thick, which supports at least one layer of conductors arranged in a manner to provide fields of pads for connecting and bonding the integrated circuit chips carried thereto. In other areas of the module 10, there is an orderly repetitive pattern of contact pads 14 which are connected to the pads 18 on the printed circuit board 12 by the connector assembly to be described in full detail hereinafter.

The connector assembly illustrated in the drawings functions to electrically connect contact pads 18 (FIG. 3) on the surface 20 of the first substrate, or printed circuit board, 12 to corresponding contact pads 14 on the surface 16 of the second substrate, or module, 10.

Accordingly, the connector assembly comprises a plurality of contact members, structure for positioning the contact members, and structure for holding the module, the printed circuit board or other substrate, and the positioning structure to provide the electrical interconnections between the contact pads 14 and the contact pads 18.

As shown in FIG. 1A, a first exemplary contact member 22 is preferably stamped from flat sheet stock and has a body portion 24, a first contact portion 26 and a second contact portion 28. The body portion 24 is substantially S-shaped and the first and second contact portions 26, 28 extend generally perpendicularly away from respective ends of the body portion 24 within he plane defined by the body portion 24.

Referring to FIG. 1B, a second exemplary contact member 22, is also preferably stamped from flat sheet stock and has a body portion 24', a first contact portion 26' and a second contact portion 28'. The body portion 24' forms a substantially closed loop between the first contact portion 26, and the second contact portion 28' Thus, the body portion 24, is generally C-shaped and is formed with an extension 25, which extends from the body portion 24, adjacent the first contact portion 26, into rubbing engagement with the body portion 24, adjacent the second contact portion 28, This rubbing engagement is effected upon compression of the contact member 22, when the connector assembly is fully assembled, as will become apparent from the following discussion.

FIG. 1C illustrates a further exemplary contact member 22" which is similar to the FIG. 1B exemplar except that instead of the body portion 24" being C-shaped, it is serpentine in character.

The exemplary contact members 22, and 22" shown in FIGS. 1B and 1C, respectively, have their first and second contact portions substantially co-linear. However, it is not intended that this configuration be limiting insofar as the scope of this invention is concerned, since the first and second contact portions can extend over a relatively wide variety of positions, as may be seen from a study of FIG. 1A, where the contact portions 26 and 28 are at opposite sides of the body portion 24.

The following description of the inventive connector assembly utilizes the contact member 22 shown in FIG. 1A. It is understood that this description also applies th the contacts members shown in FIGS. 1B and 1C as well as to any other appropriate configured contact members, with obvious modifications to the connector assembly, as will be apparent to one of ordinary skill in the art.

The structure for positioning the contact members 22 includes a plurality of plates of different types. A first type of plates is a plurality of spacer plates 30 which are stacked to a height substantially equal to the dimension H of the contact member body portion 24 between the first 26 and second 28 contact portions, as indicated by the dimension H in FIG. 3. The spacer plates 30 are formed with a plurality of apertures 32 of substantially rectangular configuration having a defined major axis. The length of each of the apertures 32 along the major axis is slightly greater than the dimension W in relation to the contact member 22 (FIG. 1A), with the width of each of the apertures 32 being of sufficient dimension to accommodate the thickness of a contact member 22 with slight clearance. When the spacer plates 30 are stacked together in alignment, the apertures 32 form a plurality of chambers each for accommodating therein the body portion 24 of one of the contact members 22. Although a plurality of plates 30 is illustrated, a single thick plate may also be utilized. Also, the apertures in all of the plates of the stack need not be identical, but rather may be so sized that when the plates are stacked the contour of the chambers more closely fits the body portion of the contact member.

The positioning structure also includes a lower reference plate 34 and an upper reference plate 36. The lower reference plate 34 is adjacent a first side of the stack of spacer plates 30 and the upper reference plate 36 is adjacent a second side of the stack of spacer plates 30, opposite the first side. The lower reference plate 34 defines a first major planar surface 38 of the positioning structure, while the upper reference plate 36 defines a second major planar surface 40 of the positioning structure.

Each of the lower and upper reference plates 34, 36 has a pattern of apertures 42, 44, respectively, therethrough. These apertures 42, 44 are elongated in configuration and are of appropriate dimension that the first 26 and second 28 contact portions, respectively, are accommodated therein with slight clearance. The apertures 42 of the lower reference plate 34 are positioned at a first plurality of predetermined precise locations corresponding to the locations of the contact pads 18 on the printed circuit board, or other substrate, 12. Similarly, the apertures 44 of the upper reference plate 36 are positioned at a second plurality of predetermined precise locations corresponding to the locations of the contact pads 14 on the module !0. These apertures 42, 44 communicate with respective ones of the chambers formed by the apertures 32 in the stack of spacer plates 30. As is clearly shown in FIG. 3, the thickness of the reference plates 34, 36 is less than the dimension L (FIG. 1A), which is the dimension of the first 26 and second 28 contact portions extending away from the body portion 24 of the contact member 22. Although the lengths of the first 26 and second 28 contact portions are shown as being substantially equal, this is not a requirement. Thus, the thicknesses of the reference plates 34, 36 may differ. What is a requirement is that these thicknesses are less than the lengths of the corresponding contact portions. The contact portions 26, 28 are therefore exposed at the planar surfaces 38, 40, respectively. Accordingly, as will become apparent, when the connector assembly is clamped down, the contact member 22 is compressed and its inherent resiliency results in the provision of a contact force to insure good electrical contact between the contact portions 26, 28 and the contact pads 18, 14, respectively.

In accordance with the principles of this invention, the outer periphery of the upper reference plate 36 may be configured to match the outer periphery of the module 10. As part of the structure for holding the entire connector assembly, there is provided a nest plate 46 having a central opening 48 which is complemental to the outer periphery of the module 10 and the upper reference plate 36. The thickness of the nest plate 46 is substantially equal to the combined thicknesses of the upper reference plate 36 and the module 10, and when assembled, the upper reference plate 36 and the module 10 are within the central opening 48 of the nest plate 46.

To complete the assembly in a separable manner, there is provided a bottom clamp member 50 and a top clamp member 52, as well as an insulator plate 54. The bottom clamp member 50 is provided with a plurality of internally threaded openings 56, and the insulator plate 54, the printed circuit board 12, the lower reference plate 34, the spacer plates 30, the nest plate 46, and the top clamp member 52 are provided with through-bores 57 spaced to match the positions of the internally threaded openings 56 in the bottom clamp member 50. The assembly is held together by means of a plurality of threaded screws 58 which extend through the bores 57 in the top clamp member 52, the nest plate 46, the spacer plates 30, the lower reference plate 34, the printed circuit board 12 and the insulator plate 54 and are received within the internally threaded openings 56. Alternatively, the screws 58 may be inserted from the bottom of the assembly, with top clamp member 52 having a threaded opening and bottom clamp member 50 having a through-bore. Since screws 58 are used, if the module 10 needs to be replaced, the screws 58 may be removed to separate the connector assembly and effect the replacement.

As is clear from FIG. 3, the top clamp member 52 extends over the central opening 48 of the nest plate 46 to exert a downward force on the module 10 when the screws 58 are tightened. Upon such tightening of the screws 58, since the contact portions 26 and 28 initially extend beyond the reference plates 34 and 36, the contact members 22 are compressed. The S-shape of the body portion 24 of the contact members 22 provides inherent resiliency which allows such compression and results in a resilient contact force being applied to the contact pads 14 and 18 by the contact portions 28 and 26, respectively. (For the contact members shown in FIGS. 1B and 1C, the shapes of the body portions 24′ and 24″ provide the resiliency, while the extensions 25′ and 25″ result in a shortened electrical path between the contact pads 14 and 18.)

In accordance with this invention, in order to achieve the desired high density of connections, the apertures 32 are arrayed with their major axes parallel and along a line which is substantially orthogonal to the major axes of the apertures. A second line of the apertures 32 is also preferably provided. This second line is parallel to the first line, with the major axes of the apertures in the first and second lines alternating. If required, additional lines of apertures may be provided, with the major axes of the apertures in all the lines alternating. This array of the apertures 32 of the spacer plates 30 is repeated by the apertures 42 and 44 of the lower and upper reference plates 34 and 36, respectively, and also by the contact pads 14 on the surface 16 of the module 10, and the contact pads 18 on the surface 20 of the printed circuit board 12.

Due to the close proximity of the contact members 22, some means must be provided for avoiding cross talk. For that reason, the spacer plates 30, the lower reference plate 34 and the upper reference plate 36 are illustratively made of aluminum. This allows the apertures 32, 42 and 44 to b very precisely cut out of the metal by means of chemical milling, laser cutting, or other suitable fabrication technique. After the apertures are formed, the aluminum is anodized, which process results in a relatively thick, abrasion resistant dielectric layer. Such dielectric layer in some cases has a multitude of cracks which may extend down to the base metal. Accordingly, these micro-cracks are filled, by vacuum impregnation or other means, with plastic, i.e., an organic dielectric material such as for example, epoxy. The geometry which can be produced by this process is substantially smaller and more precise than can be produced by molding plastic. The plates 30, 34 and 36 can be electrically connected together and to ground, so that any current flowing through the contact members 22 will establish an electric field in the dielectric coating with the return current path in the metal of the plates, and will thus provide total isolation in terms of electromagnetic coupling between adjacent contacts, eliminating or drastically minimizing any electrical cross talk between adjacent contacts. The geometry of the chambers and the contacts can be so designed or proportioned to provide the required characteristic impedance.

There may be circumstances when aluminum cannot be used for the plates 30, 34 and 36, due to its coefficient of expansion. In such cases, other metals, such as copper, Kovar, Invar, Alloy 42 or others must be used. Since these metals cannot be treated in a manner similar to the anodization of the aluminum, a different method is used to produce the insulation layer. This method would consist of producing the metal plates with oversized apertures which are then coated with a suitable plastic, such as for example, epoxy, teflon or other insulation as the case may be.

FIG. 3 clearly shows that the contacts 22 are contained in chambers which were constructed by stacking the appropriate number of spacer plates 30. By the use of the spacer plates 30 in conjunction with the lower reference plate 34 and the upper reference plate 36, the contact members 22 can be held properly oriented in those chambers in a manner that provides proper alignment or registration between the contact pads on the module 10 and the contact pads on the printed circuit board 12 via the contact members 22. Because the plates are made of metal, the forming of the apertures therein can be very precisely controlled with tight tolerance, thereby providing a relatively high interconnection density. The use of the metal plates also results in waveguide properties of the connector assembly to prevent cross talk between adjacent contact members.

Accordingly, there has been disclosed an improved high density connector assembly for an IC chip carrier. While a preferred embodiment has been disclosed, it will be apparent to those skilled in the art that various modifications to the disclosed embodiment may be made and it is only intended that the scope of this invention be limited by the appended claims.

I claim:
1. A connector assembly for electrically connecting contact pads (18) on a surface (20) of a first substrate (12) to respective contact pads (14) on a surface (16) of a second substrate (10), comprising:
   a plurality of substantially identical contact members (22), each of said contact members including a body portion (24) and first (26) and second (28) contact portions disposed at opposite ends of said body portion (24);
   means for positioning said contact members (22), said positioning means having a first major planar surface (38), a second major planar surface (40) and being so configured as to maintain the body portions (24) of said contact members (22) between said first (38) and second (40) major planar surfaces while exposing said first (26) and second (28) contact portions of said contact members (22) at first and second pluralities of predetermined precise locations on said first (38) and second (40) major planar surfaces, respectively; and
   means for holding said first (12) and second (10) substrates and said positioning means so that the contact pad bearing surface (20) of said first substrate (12) is adjacent said first major planar surface (38) with said first substrate contact pads (18) at said first plurality of predetermined precise locations contacting respective ones of said first contact portions (26) and the contact pad bearing surface (16) of said second substrate (10) is adjacent said second major planar surface (40) with said second substrate contact pads (14) at said second plurality of predetermined precise locations contacting respective ones of said second contact portions (28);

said connector assembly being characterized in that said positioning means includes:

at least one spacer plate (30) in a stack of a height substantially equal to the dimension (H) of said contact member body portion (24) between said first (26) and second (28) contact portions, each of said spacer plates (30) having a plurality of apertures (32) located on said spacer plates (30) so that when said spacer plates (30) are stacked in alignment there are formed by said stacked apertures (32) a plurality of chambers each for accommodating therein the body portion (24) of one of said contact members (22);

a lower reference plate (34) adjacent a first side of said stack of spacer plates (30), said lower reference plate (34) having a plurality of apertures (42) sized to allow said first contact portions (26) but not said body portions (24) of said contact members (22) to pass therethrough, said lower reference plate apertures (42) being positioned at said first plurality of predetermined precise locations and communicating with respective ones of said chambers, the thickness of said lower reference plate (34) being less than the dimension (L) of said first contact portion (26) extending away from said body portion (24); and an upper reference plate (36) adjacent a second side of said stack opposite said first side, said upper reference plate (36) having a plurality of apertures (44) sized to allow said second contact portions (28) but not said body portions (24) of said contact members (22) to pass therethrough, said upper reference plate apertures (44) being positioned at said second plurality of predetermined precise locations and communicating with respective ones of said chambers, the thickness of said upper reference plate (36) being less than the dimension (L) of said second contact portion (28) extending away from said body portion (24);

wherein each of said contact members (22) is generally planar and the width of each of said apertures is of sufficient dimension to accommodate the thickness of a contact member (22) with slight clearance;

whereby said contact member body portions (24) are positioned between said upper (36) and lower (34) reference plates within the chambers formed by the stacked apertures (32) of said spacer plates (30) with the first (26) and second (28) contact portions being exposed through said lower (34) and upper (36) reference plates at the first and second pluralities of predetermined precise locations, respectively.

2. The connector assembly according to claim 1 further characterized in that said contact member body portion (24, 24', 24") is configured to provide compressive resiliency upon the application of a compressive force to said first (26, 26', 26") and second (28, 28', 28") contact portions.

3. The connector assembly according to claim 2 further characterized in that said contact member body portion (24) is generally S-shaped.

4. The connector assembly according to claim 2 further characterized in that said contact member body portion (24', 24") is configured as a substantially closed loop between the first (26', 26") and second (28', 28") contact portions.

5. The connector assembly according to claim 4 further characterized in that said first (26', 26") and second (28', 28") contact portions are generally colinear.

6. The connector assembly according to claim 4 further characterized in that the body portion (24', 24") is formed with an extension (25', 25") which closes the loop when the contact member (22', 22") is compressed, the extension (25', 25") extending from said body portion (24', 24") adjacent a first of said contact portions (26', 28'; 26", 28") into rubbing engagement with said body portion (24', 24") adjacent the other of said contact portions (28', 26'; 28", 26").

7. The connector assembly according to claim 2 further characterized in that said body portion (24') is generally C-shaped.

8. The connector assembly according to claim 2 further characterized in that said body portion (24") is serpentine.

9. The connector assembly according to claim 1 further characterized in that the outer periphery of said upper reference plate (36) matches the outer periphery of said second substrate (10) and said holding means includes a nest plate (46) having a central opening (48) complemental to the outer periphery of said upper reference plate (36) and said second substrate (10) with the thickness of said nest plate (46) being substantially equal to the combined thicknesses of said upper reference plate (36) and said second substrate (10), said upper reference plate (36) and said second substrate (10) being within said nest plate central opening (48).

10. The connector assembly according to claim 9 further characterized in that said holding means includes:

a first clamp member (50) located adjacent said first substrate (12) on the side opposite said first substrate contact pads (18);

a second clamp member (52) located adjacent said nest plate (46) and extending over said central opening (48);

one of said first (50) and second (52) clamp members being formed with a plurality of internally threaded openings (56), and the other of said clamp members (50, 52), said spacer plates (30), said reference plates (34, 36) and said nest plate (46) being formed with a plurality of through-bores (57) aligned with said plurality of internally threaded openings (56); and a plurality of threaded screw members (58) extending through said bores (57) into engagement with said internally threaded openings (56).

11. The connector assembly according to claim 1 further characterized in that said reference (34, 36) and spacer (30) plates are formed of a metal material coated with an insulating layer.

12. The connector assembly according to claim 11 further characterized in that said reference (34, 36) and spacer (30) plates are formed of anodized aluminum.

13. The connector assembly according to claim 1 further characterized in that said apertures (32) in said spacer plates (30) are substantially rectangular with a major axis and are arrayed with their major axes parallel and along a line which is substantially orthogonal to the major axes of said apertures (32).

14. The connector assembly according to claim 13 further characterized in that a second line of said apertures (32) is provided in said spacer plates (30) parallel to the first line with the major axes of the apertures (32) in the first line alternating with the major axes of the apertures (32) in the second line.

15. The connector assembly according to claim 13 further characterized in that a plurality of lines of said apertures (32) is provided in said spacer plates (30) parallel to the first line with the major axes of the apertures (32) in the first line and the plurality of lines alternating.

* * * * *